United States Patent [19]

Adamski et al.

[11] Patent Number: 4,918,714

[45] Date of Patent: Apr. 17, 1990

[54] X-RAY TUBE EXPOSURE MONITOR

[75] Inventors: Joseph R. Adamski, Sudbury, Mass.; Richard L. Barrett, Norwalk, Conn.; Ted Bakowski, Lewisboro, N.Y.

[73] Assignee: Varian Associates, Inc., Palo Alto, Calif.

[21] Appl. No.: 234,365

[22] Filed: Aug. 19, 1988

[51] Int. Cl.[4] .............................................. G01R 31/24

[52] U.S. Cl. .................................... 378/121; 378/117; 378/118; 378/162

[58] Field of Search ................. 378/121, 97, 117, 118, 378/200, 165, 146, 98, 162

[56] References Cited

U.S. PATENT DOCUMENTS

| | | | |
|---|---|---|---|
| 3,832,546 | 8/1974 | Morsell et al. | 378/146 |
| 4,386,320 | 5/1983 | Lafrance | 378/117 |
| 4,725,734 | 2/1988 | Nishiki | 378/19 |

FOREIGN PATENT DOCUMENTS

| | | | |
|---|---|---|---|
| 2158388 | 6/1973 | Fed. Rep. of Germany | 378/118 |

*Primary Examiner*—Carolyn E. Fields
*Assistant Examiner*—David P. Porte
*Attorney, Agent, or Firm*—Stanley Z. Cole; Gerald M. Fisher; David Schnapf

[57] ABSTRACT

An X-ray tube exposure monitor for recording the emissions from a diagnostic X-ray tube. A photo diode is mounted inside the X-ray tube bulkhead and detects radiation from the X-ray tube. The photo diode is connected to a high gain amplifier and, in response to radiation being detected, the output of the amplifier sends an electronic signal to a microprocessor. The microprocessor records the emission duration and the temperature of oil around the X-ray tube and increments an exposure count. The recording and exposure count is stored in non-volatile memory which is read later by a service technician.

32 Claims, 4 Drawing Sheets

BEST AVAILABLE COP`

BEST AVAILABLE COP`

X-RAY TUBE EXPOSURE MONITOR

BACKGROUND OF THE INVENTION

This invention relates to a method and apparatus for monitoring X-ray radiation, and more particularly to a method and apparatus for monitoring X-ray radiation in a CT X-ray tube housing.

As is well known, X-ray tubes are currently used in various medical equipment for making X-ray images of patients. The X-ray images are then used for various diagnostic functions. An X-ray tube gives off a beam of X-ray radiation. Part of this X-ray radiation is absorbed by the body and part of the X-ray radiation radiates through the body. To make an X-ray image, a piece of X-ray film is placed behind the body and an X-ray tube is aimed at the front of the body. When the tube generates X-ray energy, a shadow graph appears on the developed film.

Another type of X-ray tube is a CT X-ray tube which is used in CT (Computerized Tomography) scan machines. This tube puts out a planar beam which is then rotated around the body during operation. Various sensors are located around the body to detect the intensity of the beam. The sensors are connected to a computer which generates an image of a slice of the body. The CT X-ray tube is then moved longitudinally along the body sequentially generating slices so that the computer can generate a three-dimensional image of the body.

CT X-ray tubes are relatively expensive and therefore, it is desirable that tube manufacturers have a way of monitoring the total tube operation time for warranty purposes. For institutions such as hospitals to be able to afford such equipment, the CT scan machine must be run continuously. This constant operation causes the CT X-ray tube to become hot. Further, the high temperatures within the CT X-ray tube result in gases being given off within the X-ray tube housing which limit the life expectancy of a CT X-ray tube. Due to a CT X-ray tube's limited life expectancy, both the number of exposures and time of each exposure may need to be monitored to measure the tube's total time of operation. The monitored measurements can then be used to calculate tube warranties.

Further, it is desirable to get status information about the environment of the X-ray tube during operation. This information which includes the exposure time, the housing temperature and exposure rate can be used in a reliability analysis. This analysis can be used to predict the number of exposures before tube failure. Further analysis can then be done to examine the effect of median exposure time and housing temperature on the X-ray tube's reliability.

Two prior ways in which X-ray tubes are monitored are as follows. First, a counter is connected to the power switch in the CT scan machine so that the count is incremented by one each time the tube is activated. Accordingly, the counter keeps track of the number of cycles of the X-ray tube. This method of exposure count monitoring is inaccurate because CT X-ray tubes are interchangeable and can be easily switched in and out of the CT scan machine. For example, when a second tube is swapped in for a first tube, the exposure count is inaccurate, as it would be indeterminate whether the count is for the first or second tube. Further, a power switch counter has further deficiencies as it is not able to record the temperatures within the CT X-ray tube housing. Also, current power switch counters do n indicate the length of an CT X-ray tube exposure.

A second method of monitoring the exposure of X-ray tube involves the use of exposure equipment tl measures X-ray radiation. This exposure equipment placed in the front of the X-ray tube and monitors t exposure time and the power of each cycle. Howev this piece of test equipment is not physically tied to a CT X-ray tube. Accordingly, CT X-ray tubes can s be swapped in and out of the CT scan machine, there giving an inaccurate reading of the life cycle for the C X-ray tube presently in the CT scan machine. Tl second method requires human intervention to acc rately record the X-ray tube cycles which can result inaccuracies in the life cycle data.

SUMMARY OF THE INVENTION

An object of the invention is to provide an improv X-ray tube exposure monitor.

Another object is to provide an improved method monitoring an X-ray tube.

Also an object is to provide an improved X-ray tu monitor that records the status of the X-ray tube duri operation.

In addition, an object is to provide a monitor which connected to the X-ray tube housing.

Further, an object is to provide a recording of t exposure count of the X-ray tube over the tube's life A further object is to provide a recording of t exposure times over the life of the X-ray tube.

In addition, an object is to provide a recording of t date and times of the exposures over the life of t X-ray tube.

Another object is to provide an apparatus wh measures and records the temperature of the liqu surrounding the X-ray tube during the tube exposure A further object is to provide an apparatus wh retains the measurements, in memory, of the vario exposure information during operation.

Also an object is to provide an apparatus which lows the X-ray tube exposure data results stored memory to be accessed at a later point in time.

An additional object is to provide an apparatus wh is hidden from view to prevent inadvertent tamperin In accordance with the present invention, an appar tus is provided comprising an X-ray tube housin means disposed within the X-ray tube housing for ge erating X-ray radiation and means integrally connect to the X-ray tube housing for sensing and recordi operating parameters of the X-ray tube for subseque analysis. It may be preferable that the recording mea is substantially mounted within the X-ray tube housin It may also be preferable that the X-ray generati means comprise an X-ray tube. Additionally, it may preferable that the sensing means sense the temperatu at one or more locations within the X-ray tube housir and the recording means stores the value of the tempe ature.

The invention may further be practiced by providi an apparatus comprising means disposed within a ho ing for generating X-ray radiation, means connected the housing for sensing the presence of X-ray radiatic and means for recording the presence of X-ray radiati in response to the sensing means detecting the presen of X-ray radiation. It may be preferable that the sensi means is substantially mounted within the housing. may also be preferable that the X-ray generating mea comprises an X-ray tube. It may further be preferable that the sensing means comprises a photo-diode which is electrically coupled to a high-gain amplifier. It may also be preferable that the recording means is substantially mounted within the housing. Additionally, the apparatus comprises means for sensing the temperature around the X-ray radiation generating means, and means electrically coupled to the X-ray radiation sensing means for recording the temperature around the X-ray generating means. It may further be preferable that the recording contains a count corresponding to the number of times the sensing means detects the presence of X-ray radiation. It may also be preferable that the recording and sensing means are disposed within the housing. The apparatus could further comprise means disposed within the X-ray tube for storing the recording in a data storage element wherein the results of the recording can be accessed upon servicing of the X-ray tube.

The invention may also be practiced by the method of monitoring X-ray radiation from an X-ray tube having a housing comprising the steps of generating X-ray radiation, sensing the presence of the X-ray radiation from the X-ray tube from inside the X-ray tube housing, and recording the presence of the X-ray energy in response to the presence of X-ray radiation being sensed. It may be preferable that the method further comprise the step of storing the recording in a non-volatile memory or a battery backed-up volatile memory. It may also be preferable that the method further comprise the step of accessing the stored recording upon servicing of the X-ray tube. Alternately, the method comprises the steps of sensing the temperature around the X-ray tube, and recording the temperature around the X-ray tube when the presence of X-ray radiation is sensed.

BRIEF DESCRIPTION OF THE DRAWINGS

The foregoing objects and advantages will be more fully understood by reading the Description of the Preferred Embodiments with reference to the drawings wherein.

DESCRIPTION OF THE PREFERRED EMBODIMENTS

Figure 1:
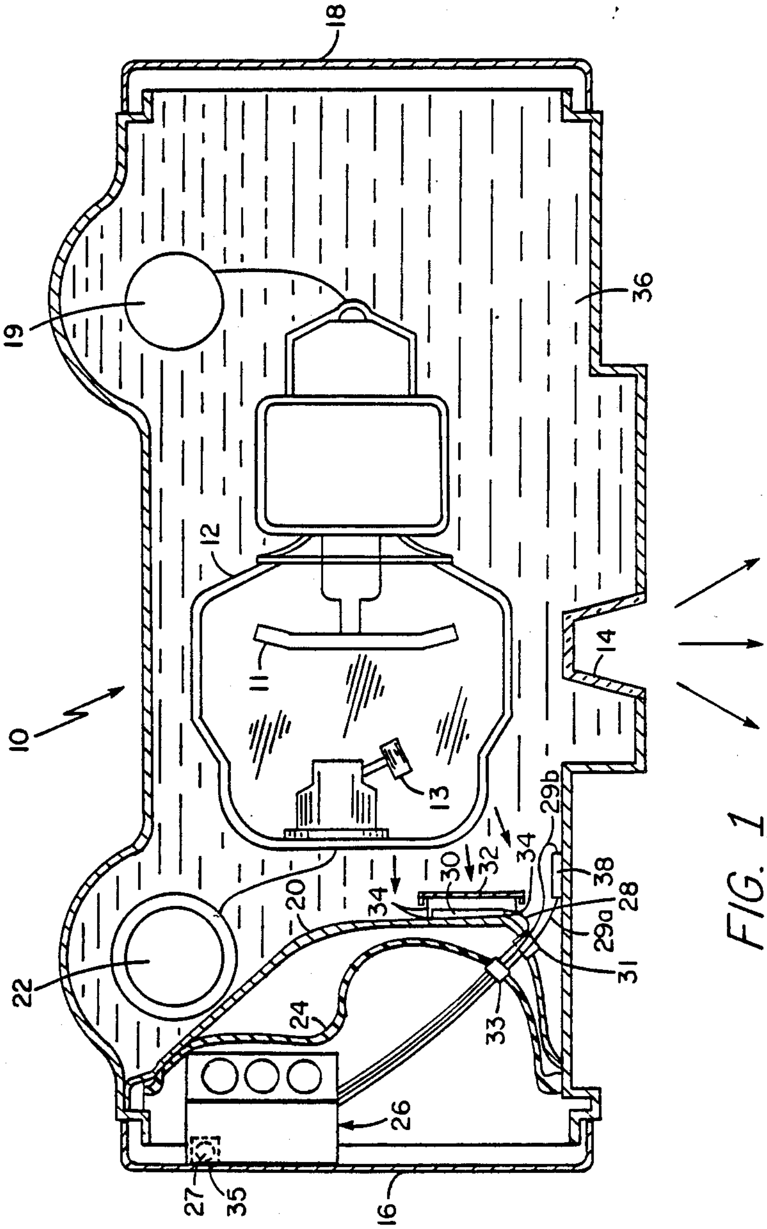
FIG. 1 is a sectional view of the X-ray tube housing with an X-ray tube exposure monitor attached therein.

Referring now to FIG. 1, shown is a CT X-ray tube housing 10 containing a CT X-ray tube 12 and an opening 14. CT X-ray tube housing 10 also contains an anode 11 and cathode 13 inside X-ray tube 12. Connectors (not shown) are wired to cathode 13, anode 11 and attached receptacles 22 and 19 to conduct the high voltage from a CT power supply (not shown) to X-ray tube 12. Located on the ends of housing 10 are end caps 16 and 18. Between end cap 16 and lead pan 20 is rubber diaphragm 24. CT X-ray tube exposure monitor circuitry 26 is positioned between rubber diaphragm 24 and end cap 16, and is attached to end cap 16 with an RTV adhesive 35, structural hardware or equivalent.

Wire 28, which extends through aperture 31 in lead pan 20 and aperture 33 in rubber diaphram 24, connects monitor circuitry 26 to photodetector 30. Photodetector 30 is a photodiode, such as Edmund Scientific P-36646 or equivalent, and is mounted on a lead pan 20 with RTV adhesive 34, or equivalent. Photodetector 30 shown is photoconductive; however, photodetector 30 may be a series of photo voltaic cells. Optionally, a high efficiency intensifying screen 32 or flourescent intensifying screen is mounted adjacent photodetector 30, such as shown between the photodetector and CT X-ray tube 12. Intensifying screen 32 is also held in place with RTV adhesive 34.

Insulation oil 36 is disposed within CT X-ray tube housing 10 and provides uniform heat distribution within CT X-ray tube housing 10 during CT X-ray tube 12 operation.

Wires 29 *a* and *b*, which are routed through apertures 31 and 33, connect monitor circuitry 26 to thermistor 38. Thermistor 38 is physically attached to housing 10 and is surrounded by insulation oil 36. Thermistor 38 provides a means for the monitor circuitry 26 to sense the temperature of the insulation oil 36. Alternately, the thermister 38 may be mounted on monitor circuitry 26 and not in insulation oil 36 to the monitor temperature within or around housing 10. The thermister 38 shown is Analog Devices AD590; however, other temperature sensors could be used, such as thermocouples or IC temperature transducers.

The monitor circuitry 26 may be connected to sensors that detect other operating parameters of the X-ray tube 12. Some of the operating parameters that sensors may monitor include the following: the radiation intensity of the X-ray energy, the attitude of the X-ray tube housing 10, the acceleration of the X-ray tube 10 housing, the temperature of the air surrounding the X-ray tube, the temperature of the anode or various other components within the X-ray tube 12, the rate of flow of the oil 36, the presence of gas within oil 36, the pressure within X-ray tube housing 10 and the rotation of anode 11.

Figure 2:
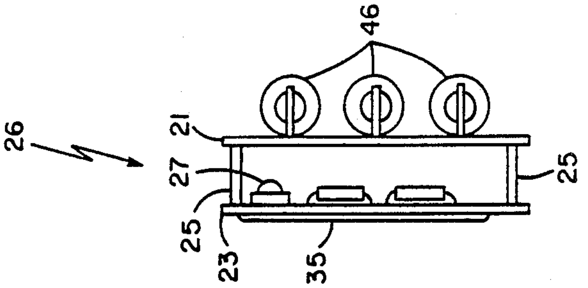
FIG. 2 is a view of the monitor circuit board shown in FIG. 1.

Referring to FIG. 2, shown is a side view of the monitor circuitry 26 shown in FIG. 1. Monitor circuitry 26 is mounted on first circuit board 21 and second circuit board 23 which are separated by connectors 25. Battery power supply 46 is mounted on first circuit board 21. RS-232 connector 27 is mounted on second circuit board 23.

Operation is described using a CT X-ray tube 12; however, photodetector 30, with monitor circuitry 26, will work with any X-ray generating device.

In operation, CT X-ray tube 12 is powered on. X-ray emissions then radiate from CT X-ray tube 12 through main opening 14 and are applied to the object being scanned. In addition, X-ray emissions are also emitted in the direction of end cap 16. The intensifying screen 32 located on lead pan 20 absorbs and then magnifies the emitted radiation from CT X-ray tube 12. Photodetector 30 then receives the magnified radiation from the intensifying screen 32. In turn, photo-detector 30 converts the received radiation to an electrical signal which is coupled via wire 28 to monitor circuitry 26.

Figure 3:
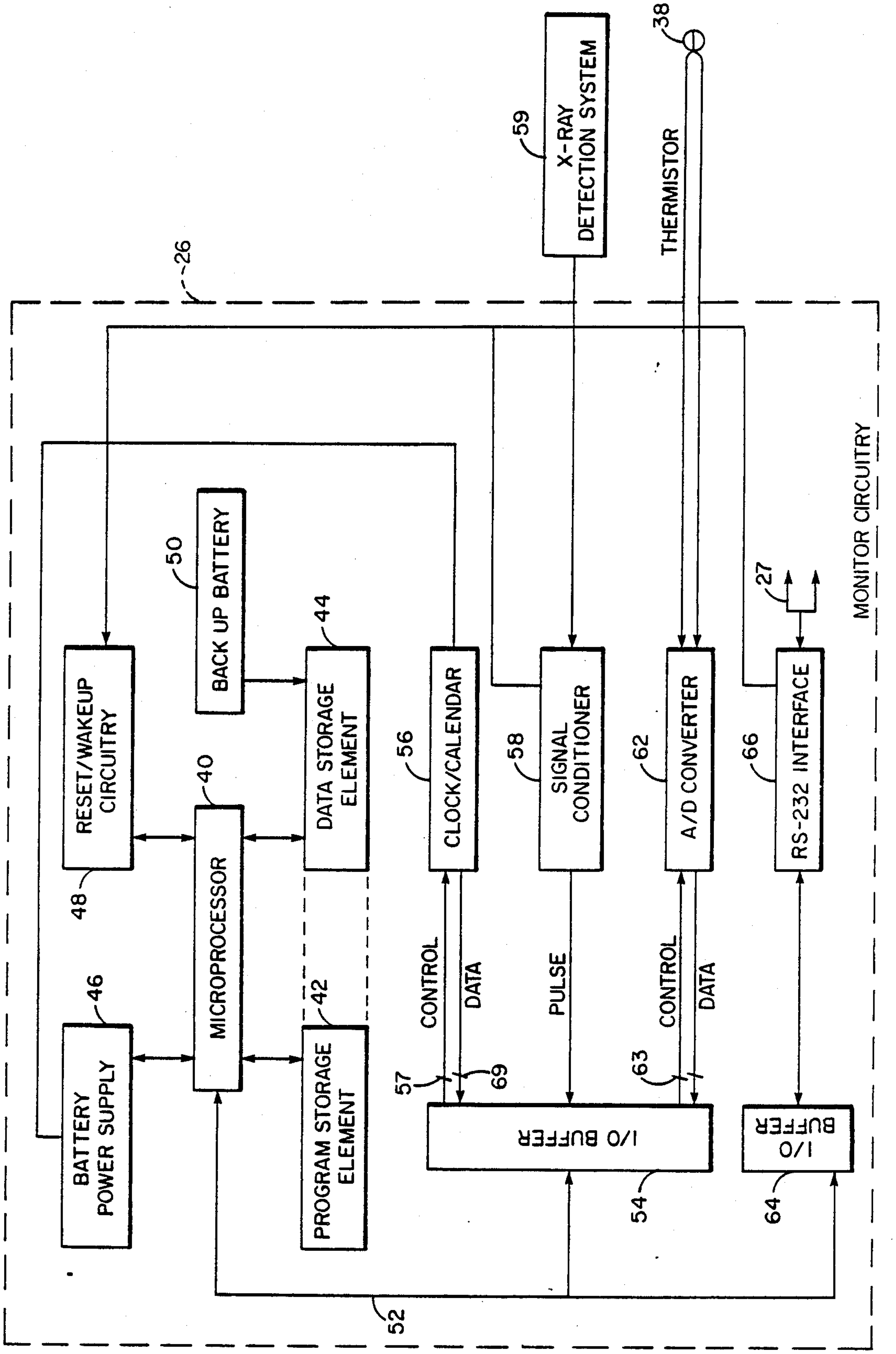
FIG. 3 is a schematic block diagram of the X-ray tube exposure monitor.

In response to the electrical signal from photodetector 30, monitor circuitry 26 enters an active cycle wherein it may record the length of time of the radiated emission, notes the time of day and date of the emission, increments an internal emission count and stores monitor information in a data storage element 44 (FIG. 3). During an active cycle, monitor circuitry 26 may also detect the temperature of insulation oil 36 by monitoring the internal resistance of thermistor 38. More specifically, monitor circuitry 26 provides a reference voltage on wire 29*a* and then determines the internal resistance of thermistor 38 by sensing the voltage change on wire 29*b*. The internal resistance is converted to its corresponding temperature which is then recorded in data storage element 44. Further details of the temperature monitoring operation within monitor circuitry 26 will be explained in connection with FIGS. 3, 4 and 5.

In response to an internal timer within monitor circuitry 26, or the sensor detecting activity occurring in or around X-ray tube housing 10, monitor circuitry 26 enters an active cycle. Monitor circuitry 26 may then record the detected activity in data storage element 44.

During service of the CT scan machine, the housing 10 is removed from the CT scan machine. End cap 16, along with monitor circuitry 26, is then removed from housing 10. After monitor circuitry 26 is disassembled from end cap 16, the monitor circuitry 26 is then connected to an external computer (not shown) via an RS-232 cable which plugs into a connector 27. The external computer may be a personal computer, miniframe, or any data processing equipment which can store and process the information in monitor circuitry 26. The data stored within data storage element 44 is then transferred into the external computer where analysis on the data is performed. This analysis includes noting the number of cycles that the CT X-ray tube 12 has operated. The analysis also includes observing temperatures of the insulation oil 36 during operation to determine what effects the temperature of the insulation oil 36 of the housing 10 has on the CT X-ray tube 12 failing. Further, the other operating parameters that occur during X-ray tube operation may be monitored.

By having an automatically controlled monitor, X-ray tube information can be stored and later retrieved to verify warranty status and to gather data for life cycle analysis. By embedding the monitor within the CT X-ray tube housing 10, human intervention and inadvertent tampering are avoided, thereby providing more accurate X-ray tube information.

Referring to FIG. 3, shown is a block diagram of monitor circuitry 26. Monitor circuitry 26 includes a microprocessor 40 connected to a program storage element 42, data storage element 44, battery power supply 46 and reset/wakeup circuitry 48. Alternately connected to data storage element 44 is back up battery 50.

Microprocessor 40 is connected through I/O bus 52 to I/O buffer 54 and I/O buffer 64. I/O buffer 54 is connected through control lines 57 and data lines 69 to clock/calendar 56. Also, I/O buffer 54 is connected through signal conditioner 58 to X-ray detection system 59 which includes photo-detector 30 and intensifying screen 32. Signal conditioner 58 contains a high gain amplifier connected to a voltage or pulse generator. High gain amplifier may not be required in all implementations of the photodetector 30. Further, I/O buffer 54 is connected through A/D converter 62 to thermistor 38.

I/O buffer 64 is connected to RS-232 interface 66 which includes a communications chip (not shown). RS-232 interface 66 is wired via connector 27 to an external computer to provide a medium in which an external computer can transfer information from monitor circuitry 26. The external computer can then be used to examine the monitor circuitry 26 information.

Microprocessor 40 is preferably constructed by a CMOS process thereby requiring very little power to operate. Program storage element 42 holds a monitor program, which will be explained in more detail later in connection with FIGS. 4 and 5. Data storage element 44 retains data when power to the CT X-ray housing 10 is disconnected and may include either a non-volatile memory or a volatile memory backed up by battery 50. The data storage element 44 stores the CT X-ray tube 12 operational information. Battery power supply 46 includes a battery or series of batteries that provide power to the monitor circuitry 26. Power supply 46 is connected to microprocessor 40, data storage element 44, program storage element 42 and clock/calendar 56. Power from power supply 46 to the remaining monitor circuitry 26 is selectively controlled by microprocessor 40. Reset/wakeup circuitry 48 contains hardware that restarts or awakens monitor circuitry 26 when the microprocessor 40 detects the presence of X-ray radiation via X-ray detection system 59 and signal conditioner 58.

I/O bus 52 provides an interface for microprocessor 40 to communicate with I/O buffer 54 and I/O buffer 64. Clock/calendar 56 provides an integrated circuit which contains a time and date stamp for microprocessor 40 to read when X-ray radiation is detected. Clock/-calendar 56 also contains a programmable timer. Clock/calendar 56 is connected to I/O buffer 54 through control lines 57 and data lines 69. One of the control lines 57 is a timeout line, which can be set to change its state by the clock/calendar 56. The time between changes of state on timeout line 57 can be programmed into clock/calendar 56 by microprocessor 40.

Thermistor 38 is connected to a low voltage tap on power supply 46 and also connected to A/D converter 62. Thermistor 38 is used to record the temperature of oil 36 during CT tube operation. As the temperature of the insulation oil 36 changes, the thermistor 38 resistance value changes, resulting in a change in voltage on the A/D converter.

When X-ray detection system 59 receives X-ray radiation, a small amount of current flows from detection system 59 to signal conditioner 58. Signal conditioner 58 amplifies the received current and converts that current to a voltage level or pulse. The signal conditioner 58 then provides a pulse to reset/wakeup circuitry 48. Further, monitor circuitry 26 operation will be explained in more detail in connection with FIGS. 4 and 5.

Figure 4:
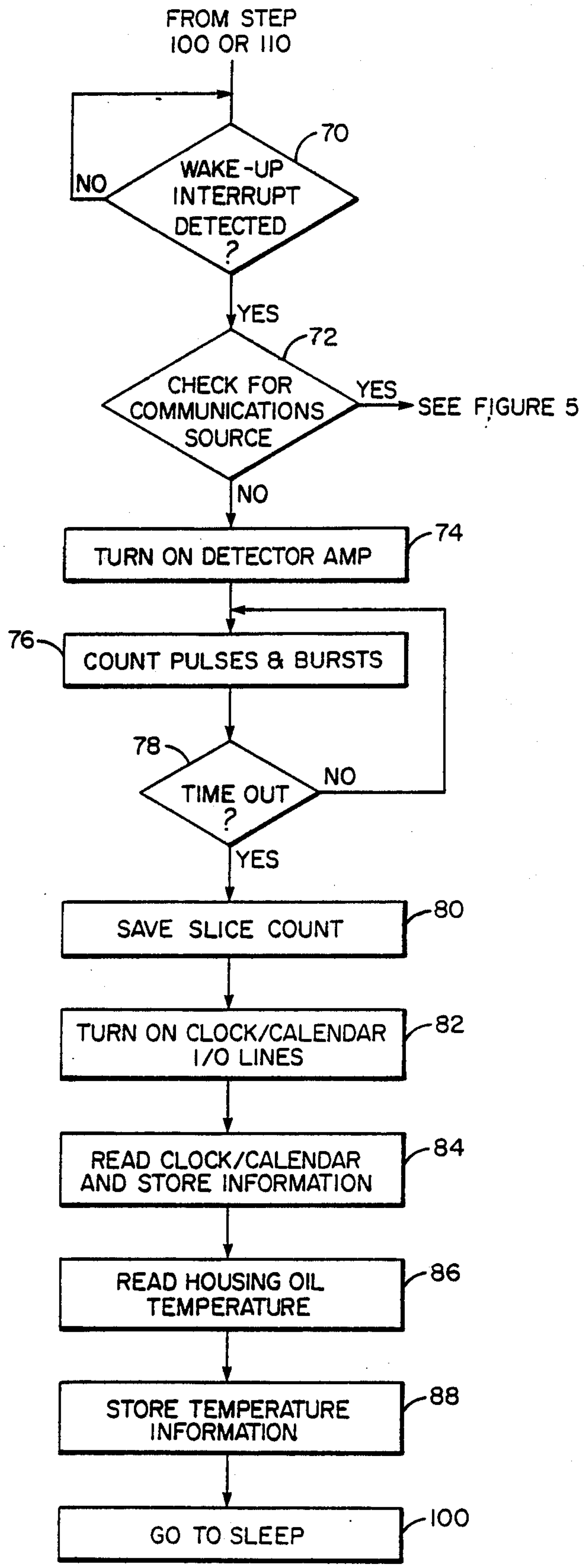
FIG. 4 shows a flow chart of the software running the X-ray tube exposure monitor.

Referring to FIG. 4, shown is a flow chart depicting the operation of microprocessor 40. The programming of a microprocessor is well known to those skilled in the art.

The first step in this flow chart is wake-up interrupt detected. In this step 70, the microprocessor continuously monitors reset/wakeup circuitry 48 until a wake-up interrupt is detected. Upon X-ray radiation being generated by CT X-ray tube 12 or a communications line being toggled within RS-232 interface 66, a wake-up interrupt signal is sent to microprocessor 40. Upon the wake-up interrupt being detected, microprocessor 40 executes step 72.

Figure 5:
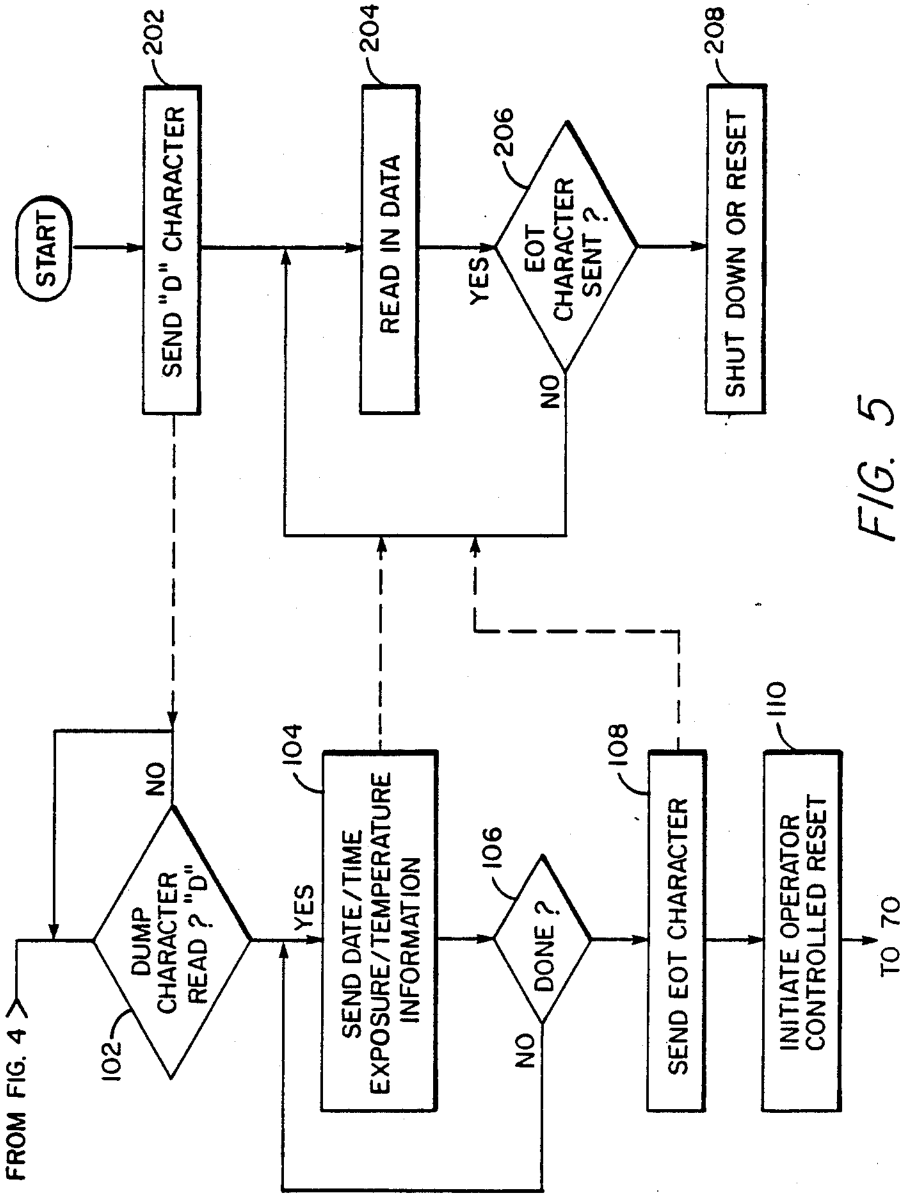
FIG. 5 shows a flow chart depicting the operation of X-ray tube exposure monitor for transferring data to an external computer, and an external computer for receiving data from the X-ray tube exposure monitor circuit.

In step 72, microprocessor 40 determines if the communications line voltage was toggled within RS-232 interface 66. If a communications line voltage was toggled, the microprocessor 40 then executes step 102 (FIG. 5). However, if there was not a communications line toggled, the microprocessor 40 executes step 74.

In step 74, the microprocessor enables power (by writing a bit to an internal power control switch or relay—not shown) to an amplifier within detection system 59. Microprocessor 40 clears the timeout circuitry in clock/calendar 56 and sets the clock/calendar 56 to toggle a first internal timing bit in clock/calendar 56 after approximately 0.5 seconds and toggle a second timing bit after approximately 10 seconds. The processor then executes step 76.

In step 76, the microprocessor 40 counts the number of X-ray pulses radiated from CT X-ray tube 12. During operation, CT X-ray tube repeatedly radiates a burst of approximately 500 pulses separated by a 0.5–2 sec. pause. A burst followed by a pause is defined as a slice. Microprocessor 40 records a running tally of the pulse count. In certain applications, the X-ray exposure may not be made of discrete pulses. In this case, the software need only record the total exposure time. The microprocessor 40 then executes step 78.

In step 78, the microprocessor 40 determines if either the clock/calendar 56 has timed out or if the exposure cycle of the X-ray tube 12 has ended by reading the first and second internal timing bits. If the first internal timing bit is set, microprocessor increments the slice count, clears the timeout circuitry in clock/calendar 56 by resetting the internal timeout registers, waits for an X-ray pulse to occur, and then executes step 76. If the second internal timing bit is set before an X-ray pulse occurs, the microprocessor 40 executes step 80.

In step 80, the microprocessor 40 saves the pulse and slice count into data storage element 44. The microprocessor 40 then executes step 82.

In step 82, the microprocessor 40 turns on operational power to the control lines 57 and data lines 69 interfacing clock/calendar 56 and the control lines 63 of the A/D converter 62. The microprocessor 40 then executes step 84.

In step 84, the microprocessor 40 reads the calendar information from clock/calendar 56 which contains the current time of day and the date. This information is then stored in data storage element 44. The microprocessor 40 next executes step 86.

In step 86, the microprocessor 40 reads the oil 36 temperature through A/D converter 62. The voltage on A/D converter 62 corresponds to a voltage level across thermister 38 which indicates the temperature of the insulation oil 36 within CT X-ray tube housing 10. The microprocessor 40 next executes step 88.

In step 88, the microprocessor 40 stores the voltage level corresponding to the temperature read from A/D converter 62 into data storage element 44. The microprocessor 40 then executes step 100.

In step 100, the microprocessor 40 goes to sleep by shuting down power to all logic except for the reset/-wakeup logic 48. The microprocessor 40 remains in a wait state, step 70, until another wake-up signal is detected. Upon detecting another wake-up signal, the microprocessor 40 executes step 72.

Referring to FIG. 5, shown is a data storage up-load flow chart for monitor circuitry 26. This flow chart is executed following the step 72 shown in FIG. 4. The first step to be executed is step 102.

In step 102, the microprocessor 40 looks for an ASCII character "D" from RS-232 interface 66. If the microprocessor has not read a character "D", the microprocessor 40 continues to monitor RS-232 interface 66 for that character. Once the microprocessor 40 has determined that the "D" character has been returned, the microprocesser 40 then executes step 104.

In step 104, the microprocessor 40 sends to the external computer (through RS-232 interface 66) a line of monitored information containing the date, time, exposure length and temperature data of a single exposure stored in data storage element 44. Once a line of information stored in data storage element 44 has been sent, the microprocessor 40 executes step 106.

In step 106, the microprocessor 40 determines if all the lines of information has been sent to the external computer. If all the lines of information have not all been sent, the microprocessor 40 reads the next line and then executes step 104. However, once all the lines of information have been sent to the external computer, the microprocessor 40 executes step 108.

In step 108, the microprocessor 40 sends a message to the external computer indicating an end of transmission (EOT). The microprocessor 40 then executes a controlled reset by resetting the logic within monitor circuitry 26. The microprocessor 40 then executes step 70.

Also shown in FIG. 5 is the flow chart of program steps performed by the external computer to transfer the data from the monitor circuitry 26. The first step in the external computer program is to establish communications with the monitor circuitry 26 by executing step 202.

In step 202, the external computer sends an ASCII "D" character to the monitor circuitry 26 through the RS-232 interface on the external computer connected to the RS-232 interface 66. The external computer then executes step 204.

In step 204, the microprocessor 40 reads a line of information from the RS-232 interface connected to monitor circuitry 26. The external computer stores the information on a line-by-line basis into its own memory. The external computer then executes step 206.

In step 206, the external computer determines if an end-of-transmission (EOT) character has been received. If this EOT character has not been received, the external computer executes step 204. If the EOT character has been received, the external computer executes step 208.

In step 208, the external computer shuts down the transmission lines, and then sets itself to a mode where the transferred data can be analyzed.

Having described preferred embodiment of this invention, it is now evident that other embodiments incorporating these concepts may be used. It is felt, therefore, that this invention should not be restricted to the disclosed embodiments, but should be limited only by the spirit and scope of the appended claims.

What is claimed is:

1. An apparatus for monitoring X-ray energy comprising:

an X-ray tube housing having a bulkhead and containing a fluid;

an X-ray tube disposed within said housing and being immersed in said fluid;

means substantially mounted within said housing for sensing the presence of X-ray radiation from said X-ray tube;

means electrically coupled to said sensing means through said bulkhead and disposed within said housing for recording the presence of X-ray radiation in response to said sensing means detecting the presence of X-ray radiation; and means disposed within said X-ray tube for storing said recording in a data storage element wherein the results of said recording can be accessed upon servicing of said X-ray tube.

2. The apparatus as recited in claim 1 wherein said sensing means comprises a photodiode and means amplifying the output of said photodiode.

3. The apparatus as recited in claim 1 wherein said sensing means comprises a series of photo diodes connected to said recording means.

4. The apparatus as recited in claim 1 further comprising:

means for sensing the temperature around said X-ray tube and disposed within said housing; and means electrically coupled to said temperature sensing means and said X-ray radiation sensing means for recording the temperature around said X-ray tube after said X-ray radiation sensing means detects the presence of X-ray radiation.

5. The apparatus as recited in claim 1 further comprising:

means for sensing the temperature of said fluid around said X-ray tube and disposed within said housing; and means electrically coupled to said fluid temperature sensing means and said X-ray radiation sensing means for recording the temperature of said fluid around said X-ray tube when said X-ray radiation sensing means detects the presence of X-ray radiation.

6. The apparatus as recited in claim 1 wherein said recording contains a count corresponding to the number of times said X-ray radiation sensing means detects the presence of X-ray radiation.

7. The apparatus as recited in claim 1 wherein said data storage element operates as a non-volatile memory device.

8. The apparatus as recited in claim 1 wherein said recording means comprises a microprocessor coupled to a battery power source.

9. The apparatus as recited in claim 1 wherein said sensing, storing and recording means is disposed within said housing.

10. A method of monitoring X-ray radiation from an X-ray tube having a housing comprising the steps of:

generating X-ray radiation;

sensing the presence of said X-ray radiation from said X-ray tube from inside said X-ray tube housing; and recording the presence of said X-ray energy in response to the presence of X-ray radiation being sensed.

11. The method of monitoring X-ray radiation as recited in claim 10 further comprising the step of storing said recording in a non-volatile memory or battery backed-up volatile memory.

12. The method of monitoring X-ray radiation as recited in claim 11 further comprising the step of accessing said stored recording upon servicing said X-ray tube.

13. The method of monitoring X-ray radiation as recited in claim 10 further comprising the steps of:

sensing the temperature of a fluid around said X-ray tube; and recording the temperature of the fluid around said X-ray tube after the presence of X-ray radiation is sensed.

14. The method of monitoring X-ray radiation as recited in claim 10 further comprising the steps of:

sensing the temperature around said X-ray tube; and recording the temperature around said X-ray tube after the presence of X-ray radiation is sensed.

15. An apparatus comprising:

an X-ray tube housing;

means disposed within said X-ray tube housing for generating X-ray radiation;

means connected to and substantially mounted within said X-ray tube housing for sensing the presence of X-ray radiation; and means for recording the presence of X-ray radiation in response to said sensing means detecting the presence of X-ray radiation;

16. The apparatus as recited in claim 15 wherein said means for generating X-ray radiation comprises an X-ray tube.

17. An apparatus as recited in claim 16 wherein said sensing means comprises a photodiode and means for amplifying the output of said photodiode.

18. An apparatus comprising:

an X-ray tube housing;

means disposed within said X-ray tube housing for generating X-ray radiation;

means connected to said X-ray tube housing for sensing the presence of X-ray radiation; and means substantially mounted within said X-ray tube housing for recording the presence of X-ray radiation in response to said sensing means detecting the presence of X-ray radiation.

19. The apparatus as recited in claim 18 wherein said X-ray generating means comprises an X-ray tube.

20. The apparatus as recited in claim 19 wherein said sensing means comprises a photodiode and means for amplifying the output of said photodiode.

21. An apparatus comprising:

an X-ray tube housing;

means disposed within said X-ray tube housing for generating X-ray radiation;

means connected to said X-ray housing for sensing the presence of X-ray radiation; and means for recording the presence of X-ray radiation in response to said sensing means detecting the presence of X-ray radiation wherein said recording means contains a count corresponding to the number of times said sensing means detects the presence of X-ray radiation.

22. The apparatus as recited in claim 21 wherein said X-ray generating means comprises an X-ray tube.

23. The apparatus as recited in claim 22 wherein said sensing means comprises a photodiode and means for amplifying the output of said photodiode.

24. An apparatus comprising:

an X-ray tube housing;

means disposed within said X-ray tube housing for generating X-ray radiation;

means disposed within and connected to said X-ray tube housing for sensing the presence of X-ray radiation; and means disposed within said X-ray tube housing for recording the presence of X-ray radiation in response to said sensing means detecting the presence of X-ray radiation.

25. The apparatus as recited in claim 24 wherein said X-ray generating means comprises an X-ray tube.

26. The apparatus as recited in claim 25 wherein said sensing means comprises a photodiode and means for amplifying the output of said photodiode.

27. The apparatus as recited in claim 24 further comprising a bulkhead disposed within said X-ray tube housing between said sensing means and said recording means for preventing X-ray radiation from said X-ray radiation generating means from escaping into the portion of said housing wherein said recording means is located.

28. The apparatus as recited in claim 27 wherein said X-ray generating means comprises an X-ray tube.

29. The apparatus as recited in claim 28 wherein said sensing means comprises a photodiode and means for amplifying the output of said photodiode.

30. The apparatus as recited in claim 25 further comprising means disposed within said X-ray tube housing for storing said recording in a data storage element wherein the results of said recording can be accessed upon servicing of said X-ray tube.

31. The apparatus as recited in claim 30 wherein said sensing means comprises a photodiode and means for amplifying the output of said photodiode.

32. An apparatus comprising:

an X-ray tube housing;

an X-ray tube disposed within said X-ray tube housing for generating X-ray radiation;

means connected to said X-ray tube housing for sensing selected operating parameters of said X-ray tube; and non-volatile memory means connected to said X-ray tube housing for cumulatively recording selected operating parameters of said X-ray tube for subsequent analysis of the life-time operating history of said X-ray tube.

* * * * *